United States Patent
Van Hal et al.

(10) Patent No.: US 6,800,350 B2
(45) Date of Patent: Oct. 5, 2004

(54) MOISTURE-ABSORPTION SHEET

(75) Inventors: Henricus Albertus Maria Van Hal, Eindhoven (NL); Rifat Ata Mustafa Hikmet, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 104 days.

(21) Appl. No.: 10/150,801

(22) Filed: May 17, 2002

(65) Prior Publication Data

US 2002/0172839 A1 Nov. 21, 2002

(30) Foreign Application Priority Data

May 18, 2001 (EP) ............................................ 01201866

(51) Int. Cl.⁷ ........................ H05B 33/04; B29C 47/00; B29C 67/00; C08K 3/00
(52) U.S. Cl. ........................... 428/68; 428/76; 428/323; 428/412; 428/413; 428/500; 428/690; 428/917; 427/66; 257/100; 313/512; 264/460; 264/464
(58) Field of Search ................................. 428/690, 323, 428/500, 412, 413, 917, 68, 76; 264/460, 464; 313/512; 257/100; 427/66

(56) References Cited

U.S. PATENT DOCUMENTS

| 4,181,637 A | * | 1/1980 | Busch et al. ................... 260/16 |
| 5,124,188 A | * | 6/1992 | Roe et al. ...................... 428/72 |
| 5,124,204 A | * | 6/1992 | Yamashita et al. ........... 428/331 |
| 6,059,860 A | * | 5/2000 | Larson ......................... 95/117 |
| 2002/0007219 A1 | * | 1/2002 | Merrill et al. ............. 623/18.11 |

FOREIGN PATENT DOCUMENTS

| EP | 1014757 A2 | 6/2000 | ........... H05B/33/04 |
| EP | 1014758 A2 | 6/2000 | ........... H05B/33/04 |

* cited by examiner

Primary Examiner—Cynthia H. Kelly
Assistant Examiner—Dawn Garrett

(57) ABSTRACT

A moisture-absorption sheet includes a small fraction of an organic polymer having a high weight-averaged molecular weight and a large fraction of particles of a moisture absorbing substance. In spite of the high content of moisture-absorbing material, the moisture-absorption sheet is not susceptible to crack formation and disintegration, and may have a high porosity. Due to these properties, the moisture-absorption sheet is particularly useful in an organic electroluminescent device.

14 Claims, 1 Drawing Sheet

MOISTURE-ABSORPTION SHEET

FIELD OF THE INVENTION

Figure 1:
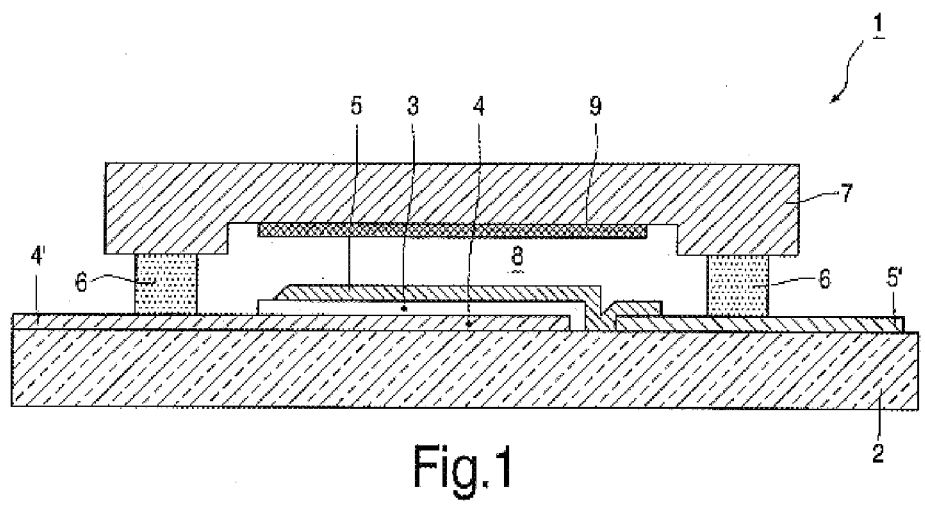

The invention relates to a moisture-absorption sheet, a method of manufacturing a moisture-absorption sheet and an organic electroluminescent device comprising such a moisture-absorption sheet.

BACKGROUND AND SUMMARY OF THE INVENTION

U.S. Pat. No. 5,124,204 discloses a moisture-absorption sheet comprising an organic polymer and comprising particles of moisture-absorbing material dispersed into the organic polymer. The moisture-absorption sheet as disclosed herein comprises an organic polymer sheet (examples are given for natural polymers, modified natural polymers and synthetic polymers) with silica gel powder dispersed therein at a certain surface density. The silica gel powder is a drying substance, which binds water.

U.S. Pat. No. 5,124,204 further describes the use of such a moisture-absorption sheet in a thin-film electroluminescent (EL) panel. The EL panel comprises a light permeable base plate, a thin-film EL element formed on the base plate and a moisture-proof sheet covering the thin-film EL element in order to prevent moisture reaching the EL element. Said EL element is further protected from moisture by said moisture-absorption sheet which is placed between said thin-film EL element and said moisture-proof sheet. Alternatively, a moisture-absorption sheet can also be obtained by providing the moisture-proof sheet with a moisture-absorption layer on the surface facing the thin-film EL element.

This prior-art moisture-absorption sheet has the drawback that, in practice, an increase of the quantity of moisture-absorbing material leads, to a reduction of the integrity of the moisture-absorption sheet and causes the moisture-absorption sheet to be susceptible to crack formation and disintegration.

It is, inter alia, an object of the invention to provide a moisture-absorption sheet, comprising an organic polymer that entangles and holds the particles of moisture-absorbing material, in spite of a high content of this material.

To this end, a first aspect of the invention provides a moisture-absorption sheet as defined in claim 1. A second aspect of the invention provides several methods of manufacturing a moisture-absorption sheet, as defined in claims 8, 9 and 10. A third aspect of the invention provides an organic electroluminescent device as defined in claim 11, comprising a moisture-absorption sheet according to the invention. Advantageous embodiments are defined in the dependent claims.

The moisture-absorption sheet of the invention comprises particles of a moisture-absorbing material which are bonded by a relatively small fraction of a polymer having a high weight-averaged molecular weight. The polymer is an organic Ultra-High-Molecular-Weight (UHMW) polymer having a weight-averaged molecular weight of more than 0.1 million. The UHMW polymer interconnects the particles of the moisture-absorbing material in such a way that the moisture-absorption sheet, in spite of the high content of moisture-absorbing material, is less susceptible to crack formation and disintegration. The result is thus, that the moisture absorption sheet of the invention is self supporting. Such self-supporting sheets are highly preferred because they are easy to handle. For example, a predetermined shape can be cut out of the sheet, which shape determines the dosage and the distribution of the moisture-absorbing material.

Using a UHMW polymer according to the invention, moisture-absorption sheets having a large fraction of particles of moisture-absorbing material could be manufactured. In a preferred embodiment of the invention, the moisture-absorption sheet comprises 80 to 99.9 wt. % (weight percentage) particles of moisture-absorbing material, and 0.1 to 20.0 wt. % UHMW polymer. More preferably, the moisture-absorption sheet comprises 95 to 99.9 wt. % particles of moisture-absorbing material, and 0.1 to 5.0 wt. % UHMW polymer.

A further advantage of the moisture-absorption sheet according to the invention is that the moisture-absorption sheet may have a high porosity. A porosity of at least 30 volume % can easily be obtained in a moisture-absorption sheet according to the invention. This porosity makes much more particles of a moisture-absorbing material easily accessible for water molecules than a consolidated moisture-absorption sheet. Due to the porosity, the moisture-absorbing substance has improved moisture-absorbing properties.

In a preferred embodiment, the polymer comprises a UHMW polymer having an average molecular weight of more than 1 million. A small quantity of such a UHMW polymer is able to interconnect the particles of a moisture-absorbing material forming a thin flexible self-supporting moisture-absorption sheet which, in spite of the high content of moisture-absorbing material, is less susceptible to crack formation and disintegration.

The UHMW polymer is preferably a linear polymer. Such a linear polymer with a high weight-averaged molecular weight forms entanglements at relatively low concentrations of the polymer in a solution, which leads to the formation of a network holding the particles of moisture-absorbing material together.

To obtain a moisture-absorption sheet having a high temperature stability, it is desirable for the polymer to be cross-linked. Cross-linking is effected by irradiation with energy in the form of, for example, electromagnetic radiation, ionizing radiation or an electron beam. Said conversion is preferably effected by means of UV radiation.

The organic polymer having a high weight-averaged molecular weight is preferably selected from the group of polyethene, polypropene, polystyrene, polyethene oxide, polypropene oxide, polyacrylate, polycarbonate, polymethylmethacrylate and copolymers thereof. The organic polymer is preferably a polyolefin compound having a high weight-averaged molecular weight.

For the polyolefin compound having a high molecular weight, use is preferably made of Ultra High Molecular Weight Polyethene (UHMWPE) or Ultra High Molecular Weight Polypropene (UHMWPP) having a weight-averaged molecular weight of 1 million or more.

This polyolefin compound may additionally be composed of a mixture of a first polyolefin, such as polyethene, having a high molecular weight, and a second polyolefin having a low molecular weight. The second polyolefin may be the same as or different from the first polyolefin.

It is alternatively possible, however, to use a mixture of a first polyolefin with a high molecular weight and a second polyolefin with a high molecular weight, which second polyolefin is different from the first polyolefin, for example, a mixture of UHMWPE and UHMWPP. Such a mixture exhibits a high resistance to high temperatures and has a low shrinkage.

Various moisture-absorbing materials may be used for the moisture-absorption sheet according to the invention such as, for example, silica gel powder or molecular sieve powder. The moisture-absorbing material preferably comprises a solid compound, which chemically absorbs the moisture and maintains its solid state even after absorbing the moisture. For example, an alkaline metal oxide compound, an alkaline earth metal oxide compound, a sulfate compound, a metal halide or halogenide compound, a perchlorate compound, an organic compound, and zeolites are available as such solid compounds of the moisture-absorbing material. Moisture-absorbing materials such as Calcium oxide, Barium oxide, Magnesium oxide, Potassium, Zelolite Sodium Alumino-Silicate, Silica gel or $P_2O_5$ are preferred.

The invention also relates to a method of manufacturing a moisture-absorption sheet. It was found that when using the organic polymer having a high weight-averaged molecular weight to bind the particles of moisture-absorbing material, uncomplicated manufacturing methods as defined in claims 8, 9 and 10 can be used.

The invention also relates to an organic electroluminescent device which is contained in a sealed container, which container is provided on the inside with a moisture-absorption sheet of the invention. U.S. Pat. No. 5,124,204 describes (in conjunction with FIG. 1) a conventional organic electroluminescent device which is prepared by forming, in this order, a lower transparent electrode (3), a lower insulation layer (4), an electroluminescent layer (5), an upper insulation layer (6) and an upper electrode (7) on a glass base plate (2). The constitution of the layers (3 to 7) is called an EL element (1), where it should be noted that in some EL elements, the electroluminescent layer (5) may function as insulation layer instead of the lower (4) and/or upper (6) insulation layer. In order to prevent moisture from reaching the EL element, it is covered by a sealing sheet (12) which is adhered to the glass base plate (2) by an adhesive (9), such as an epoxy resin. The sealing sheet (12) is composed of a moisture proof sheet (13) and a moisture-absorption sheet (14).

In order to obtain a highly reliable organic electroluminescent device, the moisture-absorption sheet should have a large quantity of moisture-absorbing material in order to be able to absorb moisture during the whole lifetime of the organic electroluminescent device. As already mentioned, the prior-art moisture-absorption sheet has the drawback that, in practice, an increase of the quantity of moisture-absorbing material leads to a reduction of the integrity of the moisture-absorption sheet and causes the moisture-absorption sheet to be susceptible to crack formation and disintegration. Due to this disintegration, particles of moisture-absorbing material may come in contact with the EL element, which may lead to degradation of the EL element. This brings us to a further advantage of the moisture-absorption sheet according to the invention: the moisture-absorption sheet according to the invention reliably binds and secures all particles of moisture-absorbing material. This advantage is particularly useful for the use of the moisture-absorption sheet in an organic electroluminescent device, as defined in claim 11.

These and other aspects of the invention are apparent from and will be elucidated with reference to the embodiments described hereinafter.

BRIEF DESCRIPTION OF THE DRAWING FIGURES

Figure 2:
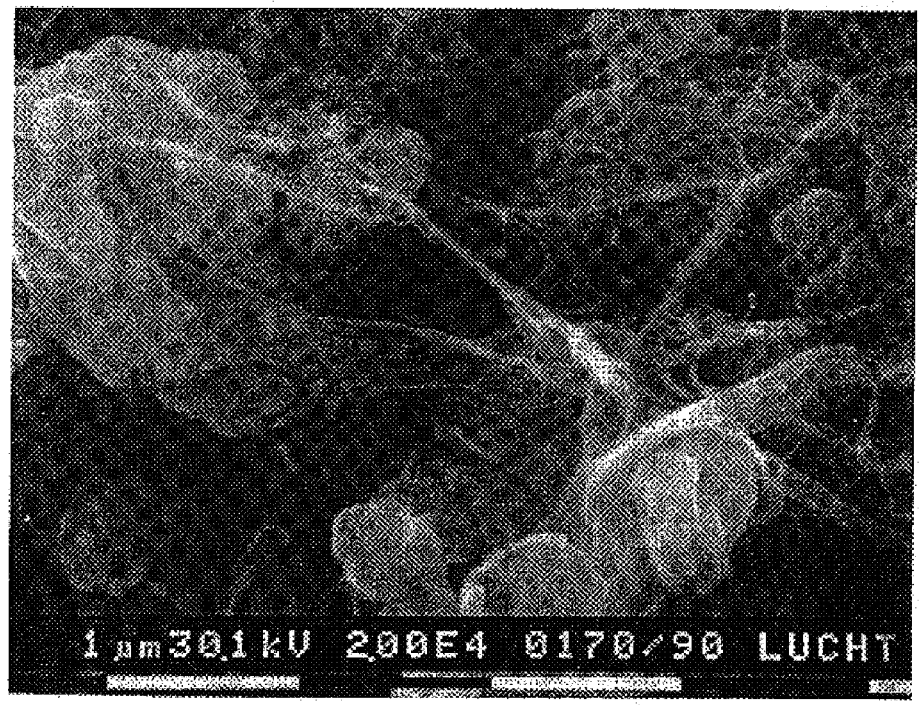

In the drawings:

FIG. 1 is a cross-section of an organic electroluminescent device comprising a moisture-absorption sheet, and FIG. 2 shows an electron-microscope image of a cross-section of a moisture-absorption sheet according to the invention.

The Figures are purely schematic and not drawn to scale. In particular for clarity, some dimensions are strongly exaggerated.

DETAILED DESCRIPTION

FIG. 1 shows an electroluminescent (EL) display device 1, comprising a glass substrate 2 on which several layers have been deposited by means of processes which are generally known in the art, such as physical or chemical vapor deposition, or ink-jet printing. The device 1 comprises an active or emissive layer 3 comprising an organic electroluminescent material, such as a coumarin (organic LED), or a conjugated polymer like PPV (poly(P-phenylene vinylene)) or a PPV-derivative (polymer LED), sandwiched between two patterns of electrode layers of an electrically conductive material. In this example, the electrode layers comprise column or data electrodes 4, which are deposited directly onto the glass substrate 2, and row or selection electrodes 5, thus forming a matrix of light-emitting diodes (LEDs). At least electrode 4 is made of a material, such as Indium Tin Oxide (ITO), that is transparent to the light emitted by the active layer 3. During operation, the column electrodes 4 are driven in such a way that they are at a sufficiently high positive voltage relative to the row electrodes 5, to inject holes in the active layer 3.

The stack of layers 3, 4 and 5 is contained in a cavity 8 which is formed by a cover 7 secured to the glass substrate 2 by an adhesive 6, such as a thermosetting two-component epoxy resin. The sealed container formed by the glass substrate 2 and the cover 7 sealed onto the substrate 2 using the adhesive 6, is provided on the inside with a moisture-absorption sheet 9 according to the invention, such that the moisture-absorbing material is spaced from the stack of layers 3, 4 and 5. For example, the moisture-absorption sheet 9 may be attached to the cover 7 as depicted in FIG. 1.

The invention will be explained by means of a number of examples, which examples should not be construed as limiting the scope of the invention.

In a first example, Calcium oxide was used as moisture-absorbing material. In order to bind the Calcium oxide particles with a size ranging from a few to several hundred microns, UHMW Polyethylene (UHMWPE) was used. The weight-averaged molecular weight of the UHMWPE was more that $10^6$ and was purchased from Aldrich. The sheet material was produced by dispersing 10 grams of Calcium oxide and 0.1 gram of UHMWPE in 10 grams decaline (decahydronaphtalene) solvent. Stirring the suspension at around 160 degrees Celsius for about 10 minutes produced a solution. The solution was cast into a tray and the solvent was allowed to evaporate. Alternatively, the Decaline may be extracted, using an excess of dichloromethane. The resulting dry films were rolled at room temperature to the desired thickness to obtain freestanding sheets with a high porosity. It was found that all of the Calcium oxide almost instantaneously reacted to form Calcium hydroxide when these sheets were subjected to a moisture atmosphere with a 80% relative humidity.

Drawing the sheets at around 100 degrees Celsius to a drawing ratio of, for example, two may increase this porosity even further.

Alternatively, the solution may be spun in a non-solvent in order to obtain a moisture-absorption sheet according to the invention.

In a second example, use was made of a polymeric binder with a low glass transition temperature such as polytetrafluoroethylene (PTFE with a weight-averaged molecular weight $M_w$ of about $10^6$) powder with a particle size of about 1 micron as in this example. The PTFE powder was dispersed in Calcium oxide particles. The PTFE concentration in the mixture was 8% by weight. Subsequently, the mixture was rolled at room temperature to produce a porous freestanding film. During mixing and rolling, the PTFE formed a matrix where the particles of moisture-absorbing material became confined. As the process was performed at room temperature, the porosity always remained but became less with an increasing polymer fraction in the system.

In a third example, a glassy atactic polystyrene ($M_w=10^7$) was mixed together with the particles of moisture-absorbing material, such as Barium oxide, in the melt of the polymer. The Polystyrene concentration in the mixture was 20% by weight. Subsequently, the melt was extruded through a flat die as a film. After cooling the film was drawn just above its glass transition temperature, at around 100 degrees Celsius, to produce a porous moisture-absorption sheet.

In a fourth example, 10% polyethylene oxide ($M_w=8\times10^6$) was mixed together with a moisture-absorbing material such as Zelolite Sodium Alumino-Silicate ($0.6K_2O:4Na_2O:Al_2O_3:2SiO_2:xH_2O$). Chloroform (80%) was added to the system in order to dissolve the polymer and aid its good mixing with the moisture absorbing particles. The mixture could be a solution cast to obtain a film which showed excellent moisture absorbing properties.

FIG. 2 shows an electron-microscope image of a cross-section of a moisture-absorption sheet according to the invention. This image illustrates how the small amount of organic polymer binds the particles of moisture-absorbing material.

In summary, the invention relates to a moisture-absorption sheet comprising a small fraction of an organic polymer having a high weight-averaged molecular weight and a large fraction of particles of a moisture absorbing substance. In spite of the high content of moisture-absorbing material, the moisture-absorption sheet according the invention is, not susceptible to crack formation and disintegration, and may have a high porosity. Due to these properties, the moisture-absorption sheet according to the invention is particularly useful for use in an organic electroluminescent device.

It should be noted that the above-mentioned embodiments and examples illustrate rather than limit the invention, and that those skilled in the art will be able to design many alternative embodiments without departing from the scope of the appended claims.

Although the moisture-absorption sheet according to the invention comprises particles of moisture-absorbing material, these particles may have any kind of shape, such as grains, flakes, elongated particles, etc.

In the claims, any reference signs placed between parentheses shall not be construed as limiting the claim. The verb "comprise" and its conjugations does not exclude the presence of elements or other steps than those stated in a claim.

What is claimed is:

1. A moisture-absorption sheet comprising an organic polymer and comprising particles of moisture-absorbing material dispensed into the organic polymer, characterized in that the organic polymer is an Ultra-High-Molecular-Weight (UHMW) polymer having a weight-averaged molecular weight of more than 0.1 million, wherein the moisture-absorption sheet comprises 95 to 99.9 wt. % particles of moisture absorbing material, and 0.1 to 5.0 wt. % UHMW polymer.

2. A moisture-absorption sheet as claimed in claim 1, wherein the polymer comprises a UHMW polymer having a weight-averaged molecular weight of more than 1 million.

3. A moisture-absorption sheet as claimed in claim 2, wherein the UHMW polymer is a linear polymer.

4. A moisture-absorption sheet as claimed in claim 1, wherein the polymer is cross-linked.

5. A moisture-absorption sheet as claim in claim 1, wherein the polymer is selected from the group of polyethene, polypropene, polystyrene, polyethene oxide, polypropene oxide, polyacrylate, polycarbonate, polymethylmethacrylate and copolymers thereof.

6. A method of manufacturing a moisture-absorption sheet as claimed in claim 1, characterized in that the particles of a moisture absorbing substance are mixed together with organic polymer particles, and subsequently rolled at a temperature around the glass transition temperature of the polymer.

7. A method of manufacturing a moisture-absorption sheet as claimed in claim 1, characterized in that the particles of a moisture-absorbing substance are mixed together with a crystalline or glassy organic polymer in the melt, and extruded as a sheet, and that the sheet is subsequently drawn at a temperature below the melting or glass transition temperature of the polymer.

8. A method of manufacturing a moisture-absorption sheet as claimed in claim 1, characterized in that the particles of a moisture-absorbing substance are mixed in an organic polymer solution, and that the solution is subsequently spun in a non-solvent.

9. An organic electroluminescent device comprising:

a substrate, an electroluminescent element which comprises at least one electroluminescent layer of organic material which is sandwiched between two conductor layers, which electroluminescent layer generates light when said layer is subjected to an electric field, a moisture-impermeable layer which, in cooperation with the substrate and an adhesive, encloses the electroluminescent element, and a moisture-absorption sheet as claimed in claim 1, said moisture absorption sheet being located between the electroluminescent element and the moisture-impermeable layer.

10. The moisture-absorption sheet of claim 1, wherein the polymer comprises a UHMW polymer having a weight-averaged molecular weight of more than 1 million.

11. The moisture-absorption sheet of claim 1, wherein the polymer is cross-linked.

12. The moisture-absorption sheet of claim 1, wherein the polymer is selected from the group of polyethene, polypropene, polystyrene, polyethene oxide, polypropene oxide, polyacrylate, polycarbon, polymethylmethacrylate and copolymers thereof.

13. An organic electroluminescent device comprising the moisture-absorption sheet of claim 1, the device including:

a substrate, an electroluminescent element which comprises at least one electroluminescent layer of organic material which is sandwiched between two conductor layers, which electroluminescent layer generates light when said layer is subjected to an electric field; and a moisture-impermeable layer which, in cooperation within the substrate and an adhesive, encloses the electroluminescent element, wherein said moisture-absorption sheet is located between the electroluminescent element and the moisture-impermeable layer.

14. The organic-electroluminescent device comprising the moisture-absorption sheet of claim 2, the device including:

a substrate;

an electroluminescent element which comprises at least one electroluminescent layer of organic material which is sandwiched between two conductor layers, which electroluminescent layer generates light when said layer is subjected to an electric filed; and a moisture-impermeable layer which, in cooperation with the substrate and an adhesive, encloses the electroluminescent element, wherein said moisture-absorption sheet is located between the electroluminescent element and the moisture-impermeable layer.

* * * * *